United States Patent [19]

Carroll

[11] Patent Number: 4,897,612
[45] Date of Patent: Jan. 30, 1990

[54] OPERATIONAL TRANSCONDUCTANCE AMPLIFIER WITH IMPROVED CURRENT SOURCE CAPABILITY

[75] Inventor: Kenneth J. Carroll, San Jose, Calif.

[73] Assignee: National Semiconductor Corporation, Santa Clara, Calif.

[21] Appl. No.: 341,910

[22] Filed: Apr. 24, 1989

Related U.S. Application Data

[63] Continuation of Ser. No. 192,010, May 9, 1988.

[51] Int. Cl.[4] ........................... H03F 3/45; H03F 3/16
[52] U.S. Cl. .................................... 330/253; 330/255; 330/277
[58] Field of Search ............... 330/252, 253, 255, 257, 330/261, 277, 311

[56] References Cited

U.S. PATENT DOCUMENTS 4,284,957  8/1981  Hague .............................. 330/255 X Primary Examiner—Steven Mottola
Attorney, Agent, or Firm—Limbach, Limbach & Sutton

[57] ABSTRACT

A two-stage, operational transconductance amplifier is provided with a rail-to-rail output swing, zero systematic offset voltage and very low quiescent current, but with the ability to both source and sink substantially greater than the output stage quiescent current to a load during transients. The amplifier has found particular application as part of a switched capacitor gain and filtering block in an implantable defibrillator, but is widely applicable.

5 Claims, 3 Drawing Sheets

OPERATIONAL TRANSCONDUCTANCE AMPLIFIER WITH IMPROVED CURRENT SOURCE CAPABILITY

This is a continuation of Application Ser. No. 192,010, filed May 9, 1988.

BACKGROUND OF THE INVENTION

1. Field of the Invention

The present invention relates to electronic circuits and, in particular, to an operational transconductance amplifier which can source more current than presently available operational amplifiers.

2. Discussion of the Prior Art

The operational amplifier of the present invention improves on the shortcomings of the two conventional operational amplifier structures which allow rail to rail output swings: the classical two stage amplifier and the classical operational transconductance amplifier.

A schematic of a classical two stage amplifier is provided in FIG. 1 and is described by Gray and Meyer, "Analysis and Design of Analog Integrated Circuits," p. 742, FIG. 12.32 (Wiley). The disadvantage of this type of circuit is that, while it can sink substantial current, it cannot source current in excess of the output stage quiescent current. Either a high quiescent current or low source capability must be accepted for any particular application.

A schematic of a classical operational transductance amplifier is provided in FIG. 2 and is described by Tsividis and Antognetti, "Design of MOS VLSI Circuits for Telecommunications," p. 129, FIG. 5.11 (Prentice Hall). This type of circuit exhibits relatively low gain since it is single staged. Furthermore, it is unable to source or sink more than twice the output stage quiescent current.

SUMMARY OF THE INVENTION

The present invention provides an operational transconductance amplifier which, like a classical two stage amplifier, has the ability to sink significant amounts of current. However, unlike both the classical two stage amplifier and the classical operational transconductance amplifier, it can also source substantially more than the output stage quiescent current during transients. Also, because of its two gain stage structure, it exhibits high gain and can swing to either rail. Due to its balanced design, it exhibits no systematic input offset voltage. Because of its ability to source more current on demand, it exhibits a substantially lower output impedance than do the classical structures.

An operational transconductance amplifier in accordance with the present invention includes a differential to single-ended input stage and an output stage. The output stage includes a pull-down device, connected between the amplifier output node and the negative rail, which is driven by the single-ended output of the input stage. An input controlled current source connected between the positive rail and the output node allows the output stage to source current greater than twice the output stage quiescent current $I_q$.

A better understanding of the features and advantages of the present invention will be obtained by reference to the following detailed description of the invention and accompanying drawings which set forth an illustrative embodiment in which the principles of the invention are utilized.

DETAILED DESCRIPTION

Figure 3:
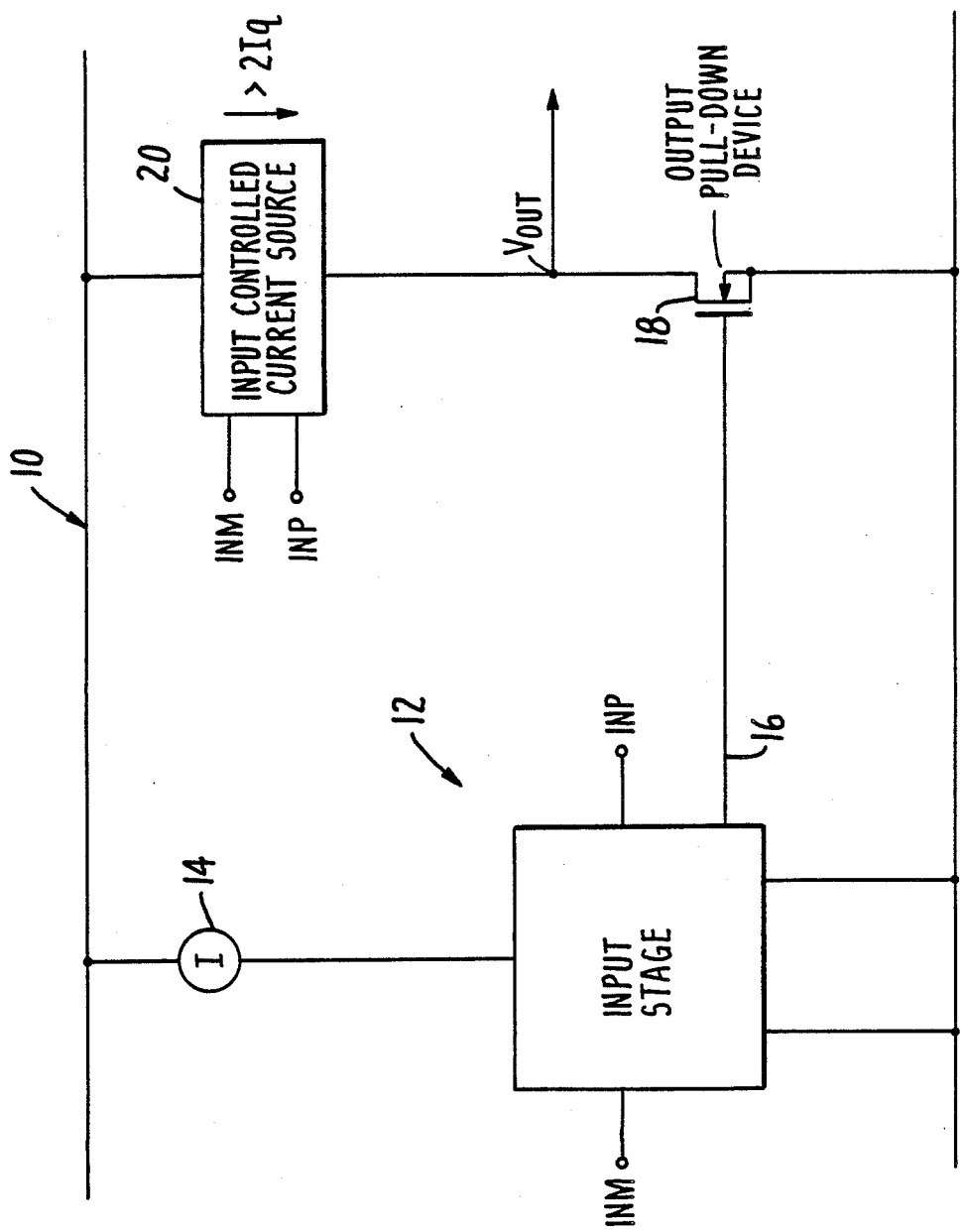
FIG. 3 is a block diagram illustrating a operational transconductance amplifier in accordance with the present invention.

FIG. 3 provides a simple block diagram which illustrates the general principle of the present invention.

As shown in FIG. 3, an operational transconductance amplifier 10 in accordance with the present invention includes a differential to single-ended input stage 12 which receives a positive input signal INP and a negative input signal INM. Input stage 12 is connected to the negative rail, and to the positive rail via a constant current source 14. The single-ended output 16 of the differential input stage 12 is provided to an output stage which includes pull-down device 18 connected between the output node $V_{out}$ of amplifier 10 and the negative rail. In accordance with the present invention, a current source 20 is connected between the positive rail and the output node $V_{out}$ to allow the amplifier 10 to source greater than twice the output quiescent current Iq under the control of the positive and negative inputs INP and INM, respectively.

Figure 4:
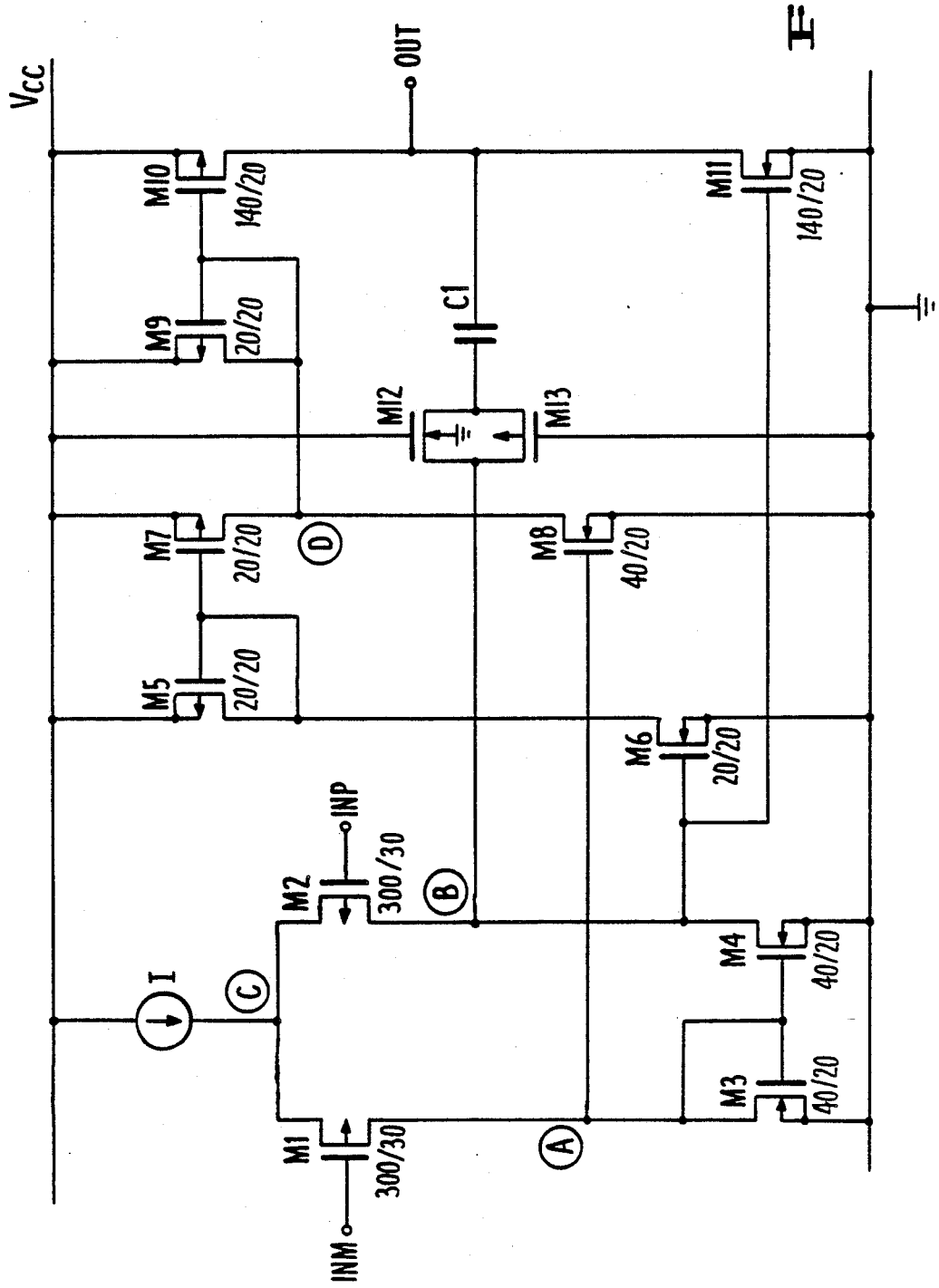
FIG. 4 is a schematic diagram illustrating a circuit implementation of an operational transconductance amplifier in accordance with the present invention.

A detailed schematic of a circuit implementation of amplifier 10 is provided in FIG. 4.

Figure 1:
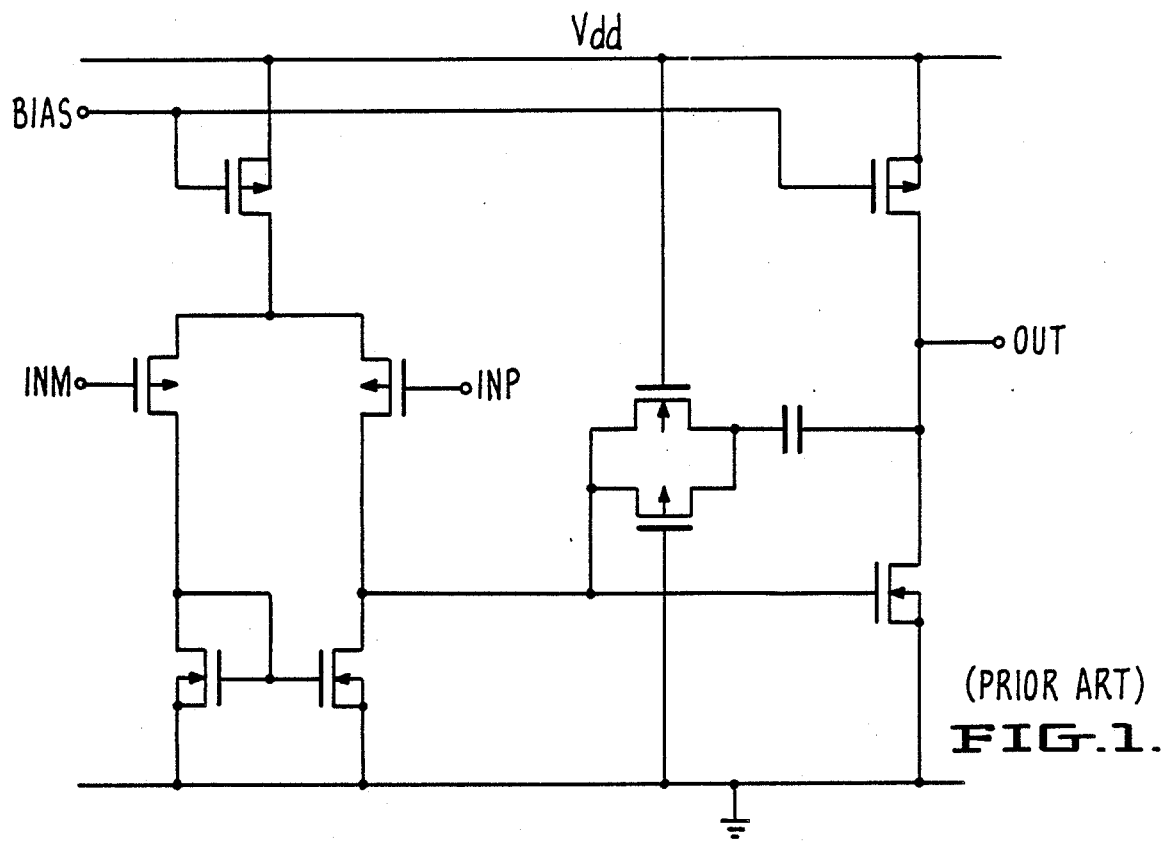
FIG. 1 is a schematic diagram illustrating a classical two stage amplifier.
Figure 2:
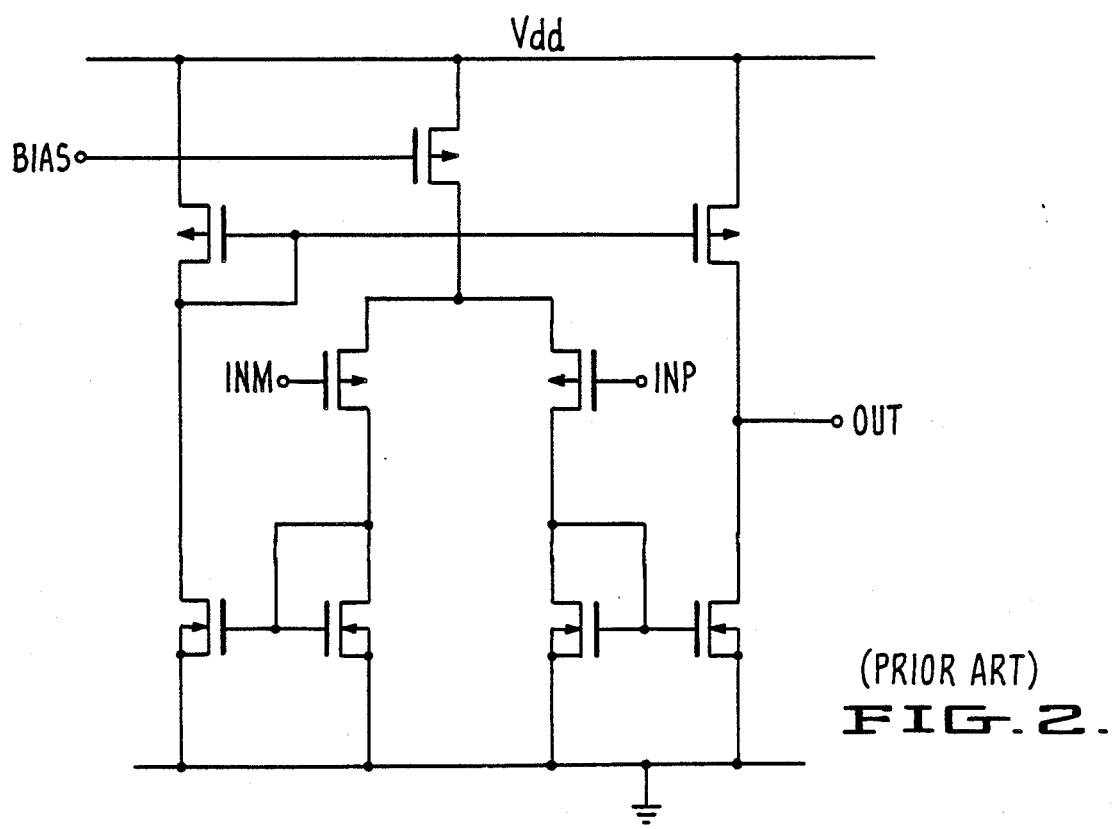
FIG. 2 is a schematic diagram illustrating a classical operational transconductance amplifier.

P-channel MOSFET devices M1 and M2 and n-channel devices M3 and M4 combine to form a standard differential to single ended input stage. N-channel device M11 is the output pull-down device which is driven by the differential pair high impedance gain node B. Thus far, the structure of amplifier 10 is identical to the standard two stage amplifier shown in FIG. 1.

As further shown in FIG. 4, the gate of n-channel device M6 is connected to node B. Device M6 drives the diode connected drain of transistor M5 of the current mirror formed by p-channel devices M5 and M7. The drain of device M7 is connected to the drain of n-channel device M8 at node D. The gate of device M8 is connected to node A, the junction between device M1 and the diode connected transistor M3 of the differential input stage current mirror formed by devices M3 and M4. Another connection to node D exists in diode-connected p-channel transistor M9 which is part of a current mirror formed by devices M9 and M10. Device M10 is the output stage pull-up device, the drain of which is connected to that of pull-down device M11. Capacitor C1 and transistors M12 and M13 combine to form a standard pole splitting compensation scheme.

In order to appreciate the current sink/source capability of the amplifier 10 of the present invention, it is helpful to analyze the following three extreme open loop conditions in the absence of the required frequency compensation. These are:

1) Quiescent state;
2) Inverting input INM pulled sufficiently above non-inverting input INP to steer all of the input stage bias current through device M2, simulating negative slewing; and 3) Non-inverting input INP pulled sufficiently above inverting input INM to steer all of the input stage bias current through device M1, simulating positive slewing.

Device size examples are provided below (and shown in FIG. 4) for a three micron poly gate CMOS process (it should be noted that the device structures are examples of a common denominator in order to eliminate geometrical mismatches and, hence, systematic input offset voltage):

M1 = 300/30
M2 = 300/30
M3 = 40/20 (2// 20/20)
M4 = 40/20 (2// 20/20)
M5 = 20/20
M6 = 20/20
M7 = 20/20
M8 = 40/20 (2// 20/20)
M9 = 20/20
M10 = 140/20 (7// 20/20)
M11 = 140/20 (7// 20/20)

Condition 1

In the quiescent state, tail current = I, that is, the current through devices M1 and M2, is balanced at I/2, as is the current through devices M3 and M4. Since device M6 has half of the transconductance of devices M3 or M4 and, hence, the current through device M6 is I/4. Device M8 is identical to devices M3 and M4 and is biased at the same potential; therefore, it's drain current is I/2. Devices M5 and M7 form a current mirror resulting in the drain current of device M7 being I/4. Since the current through device M8 is I/2 and that through device M7 is I/4, the excess current of I/4 is supplied by device M9, which is equal in size to devices M5 and M7 in order to balance the drain voltages of devices M5 and M7 and, thus, eliminate systematic offset voltage. Device M11 is biased off the same voltage as device M6 and has, in this case, seven times the geometric ratio. Thus, the drain current of device M11 is set at seven times I/4. Device M10 is also seven times the size of device M9 and, therefore, balances this current at 7I/4. Transistors M12 and M13 and capacitor C1 form a standard compensation scheme and should be ignored for this D.C. discussion.

It is readily seen that the systematic offset voltage is zero because of the balanced structure and that the output stage quiescent current is, in the embodiment described above, 7I/4.

Condition 2

When the inverting input INM is pulled sufficiently above the non-inverting input INP, all of the input stage bias current is steered through device M2 and the current through devices M1 and M3 is essentially zero. Under these circumstances, node A collapses to below a threshold voltage. The current through device M2 charges node B so that its potential equals that of node C which, in this extreme case, would be $V_{cc}$. Thus, both device M6, and more importantly, device M11, are biased on hard, their current sink capability being determined by the value of $V_{cc}$, the device geometries and process parameters. The output sink current may be many orders of magnitude greater than the original quiescent current. Device M8, being biased from node A, is off. Node D is charged to the positive rail, turning off device M10.

Condition 3

When the non-inverting input INP is pulled sufficiently above the inverting input INM, all of the input stage bias current is steered through device M1 and the current through devices M2 and M4 is essentially zero. The current through devices M1 and M3 is forced to be I. Since device M4 is mirrored off device M3, node B is pulled to ground turning off devices M6 and M11. The current through device M5 becomes zero and, as a consequence, the current through device M7 also becomes zero. Device M8, however, being biased off node A, sinks current through the only available source, device M9. The current through device M9 has, therefore, changed from I/4 in the quiescent state to I in the slewing state. This is reflected by device M10, which can now source 7I as opposed to 7I/4 in the quiescent state. By altering the ratio between devices M7 and M9, this dynamic to quiescent current ratio (4:1 in the illustrated embodiment) can be varied to suit the application.

It should be understood that the scope of the present invention is not intended to be limited by the specifics of the above-described embodiment, but rather is defined by the accompanying claims.

What is claimed is:

1. An operational transconductance amplifier comprising:
   (a) a differential to single-ended input stage which receives a non-inverting input and an inverting input, the input stage being serially connected with a constant current source between positive and negative rails, the constant current source being connected to the positive rail; and
   (b) an output stage which includes
      (i) a pull-down device which receives the single-ended output of the input stage, the pull-down device being connected between the output node of the output stage and the negative rail; and
      (ii) an input controlled current source, connected between the positive rail and the output node and to receive control signals comprising both the non-inverting input and the inverting input, for allowing the output stage to source current greater than twice the quiescent current of the output stage.

2. An operational transconductance amplifier comprising:
   (a) an input stage including
      (i) a first p-channel MOSFET device (M1) having its gate connected to receive a first input signal (INM), its source connected to a first node (C) and its drain connected to a second node (A);
      (ii) a second p-channel MOSFET device (M2) having its gate connected to receive a second input signal (INP), its source connected to the first node (C) and its drain connected to a third node (B);
      (iii) a constant current source (I) connected between the first node (C) and a positive voltage supply;
      (iv) a first n-channel MOSFET device (M3) having its gate commonly-connected to its drain and to the second node (A) and its source connected to a negative voltage supply; and
      (v) a second n-channel MOSFET device (M4) having its gate connected to the gate of the first n-channel MOSFET device (M1), its drain connected to the third node (B), and its source connected to the negative voltage supply; and (b) an output stage including
(i) a third p-channel MOSFET device (M5) having its gate commonly-connected to its drain and its source connected to the positive voltage supply;
(ii) a third n-channel MOSFET device (M6) having its gate connected to the third node, its drain connected to the drain of the third p-channel MOSFET device (M5), and its source connected to the negative voltage supply;
(iii) a fourth p-channel MOSFET device (M7) having its gate connected to the gate of the third p-channel MOSFET device (M5), its drain connected to a fourth node (D), and its source connected to the positive voltage supply;
(iv) a fourth n-channel MOSFET device (M8) having its gate connected to the second node (A), its drain connected to the fourth node (D) and its source connected to the negative voltage supply;
(v) a fifth p-channel MOSFET device (M9) having its gate commonly-connected to its drain and to the fourth node (D) and its source connected to the positive supply;
(vi) a fifth n-channel MOSFET device (M11) having its gate connected to the third node (B), its drain connected to the output node and its source connected to the negative supply; and
(vii) a sixth p-channel MOSFET device (M10) having its gate connected to the gate of the fifth p-channel MOSFET (M9), its drain connected to the amplifier output mode and its source connected to the positive supply such that the output stage sources more than twice the quiescent current of the output stage when the second input signal (INP) is sufficiently greater than the first input signal (INM) that the current supplied by the constant current source is steered through the first p-channel MOSFET device (M1).

3. An operational transconductance amplifier comprising:
(a) a differential to single-ended input stage which receives a non-inverting input and an inverting input, the input stage being serially connected with a constant current source between a first supply voltage and a second supply voltage, the constant current source being connected to the first supply voltage; and
(b) an output stage which includes
(i) an output device which receives the single-ended output of the input stage, the output device being connected between the output node of the output stage and the second supply voltage; and
(ii) an input controlled current source, connected between the first supply voltage and the output node and to receive control signals comprising both the non-inverting input and the inverting input, for allowing the output stage to pass current greater than twice the quiescent current of the output stage.

4. An operational transconductance amplifier comprising:
(a) a differential to single-ended input stage which receives a non-inverting input and an inverting input, the input stage being serially connected with a constant current source between a first supply voltage and a second supply voltage, the constant current source being connected to the first supply voltage; and
(b) an output stage which includes
(i) an output device which receives the single-ended output of the input stage, the output device being connected between the output node of the output stage and the second supply voltage; and
(ii) an input controlled current source, connected between the first supply voltage and the output node and to receive control signals derived from the non-inverting input and the inverting input, for allowing the output stage to pass current greater than twice the quiescent current of the output stage.

5. An operational transconductance amplifier comprising:
(a) differential to single-ended input stage which receives a non-inverting input and an inverting input, the input stage being serially connected with a constant current source between positive and negative rails, the constant current source being connected to the positive rail; and
(b) an output stage which includes
(i) a pull-down device which receives the single-ended output of the input stage, the pull-down device being connected between the output node of the output stage and the negative rail; and
(ii) an input controlled current source connected between the positive rail and the output node and to receive control signals derived from the non-inverting input and the inverting input, for allowing the output stage to source current greater than twice the quiescent current of the output stage.

* * * * *

UNITED STATES PATENT AND TRADEMARK OFFICE
CERTIFICATE OF CORRECTION

PATENT NO. : 4,897,612

DATED : 1/30/90

INVENTOR(S): Kenneth J. Carroll

It is certified that error appears in the above - identified patent and that said Letters Patent is hereby corrected as shown below:

On the Title Page, Item 73, delete "National Semiconductor Corporation, Santa Clara, Calif." and insert --Ventritex, Sunnyvale, Calif.--.

Signed and Sealed this

Ninth Day of April, 1991

Attest:

HARRY F. MANBECK, JR.

Attesting Officer

Commissioner of Patents and Trademarks